United States Patent
Yoshitake et al.

(10) Patent No.: US 6,667,806 B2
(45) Date of Patent: Dec. 23, 2003

(54) PROCESS AND APPARATUS FOR MANUFACTURING SEMICONDUCTOR DEVICE

(75) Inventors: Yasuhiro Yoshitake, Yokosuka (JP); Takeshi Kato, Koganei (JP); Toshihiko Nakata, Hiratsuka (JP)

(73) Assignee: Hitachi, Ltd., Tokyo (JP)

( * ) Notice: Subject to any disclaimer, the term of this patent is extended or adjusted under 35 U.S.C. 154(b) by 213 days.

(21) Appl. No.: 09/796,613

(22) Filed: Mar. 2, 2001

(65) Prior Publication Data

US 2002/0048020 A1 Apr. 25, 2002

(30) Foreign Application Priority Data

Sep. 13, 2000 (JP) ......................... 2000-283776

(51) Int. Cl.⁷ .................. G01B 11/00; G01B 11/14; G03F 9/00; G03C 5/00
(52) U.S. Cl. ............... 356/399; 356/401; 356/614; 430/22; 430/30
(58) Field of Search ................ 356/399, 401, 356/614, 237.1; 250/559.29, 559.3; 382/151; 355/53, 55; 430/22, 30

(56) References Cited

U.S. PATENT DOCUMENTS

| | | | | |
|---|---|---|---|---|
| 3,712,740 A | * | 1/1973 | Hennings | 356/152.2 |
| 4,741,622 A | * | 5/1988 | Suwa et al. | 356/401 |
| 4,901,109 A | * | 2/1990 | Mitome et al. | 355/68 |
| 5,272,501 A | * | 12/1993 | Nishi et al. | 355/53 |
| 5,333,050 A | * | 7/1994 | Nose et al. | 356/490 |
| 5,402,205 A | * | 3/1995 | Markle et al. | 355/53 |
| 5,585,923 A | * | 12/1996 | Nose et al. | 356/490 |
| 5,682,239 A | * | 10/1997 | Matsumoto et al. | 356/488 |
| 5,684,565 A | * | 11/1997 | Oshida et al. | 355/53 |
| 5,795,687 A | * | 8/1998 | Yasuda | 355/53 |
| 5,850,279 A | * | 12/1998 | Nara et al. | 355/53 |
| 6,023,321 A | * | 2/2000 | Shiraishi | 356/401 |
| 6,079,256 A | * | 6/2000 | Bareket | 355/67 |
| 6,100,987 A | * | 8/2000 | Kawakubo | 355/77 |
| 6,166,801 A | * | 12/2000 | Dishon et al. | 355/27 |
| 6,218,200 B1 | * | 4/2001 | Chen et al. | 438/14 |
| 6,297,876 B1 | * | 10/2001 | Bornebroek | 355/67 |
| 6,356,343 B1 | * | 3/2002 | Shiraishi et al. | 355/77 |

OTHER PUBLICATIONS

J. Allgair et al., *Characterization of Overlay Tolerance Requirements for Via to Metal Alignment*, SPIE Conference on Metrology, Inspection, and Process Control for Microlithography XIII, Santa Clara, CA, Mar. 1999, SPIE vol. 3677, pp. 239–247.

* cited by examiner

Primary Examiner—Zandra V. Smith
Assistant Examiner—Gordon J Stock
(74) Attorney, Agent, or Firm—Antonelli, Terry, Stout & Kraus, LLP

(57) ABSTRACT

As the size of the semiconductor devices decreases, the relative positional difference between a circuit at an exposure area and an alignment mark due to the aberrations and distortions of lenses and the reticle writing error can not be neglected. Images of circuit patterns having a very small size which are laminated are detected using lights having two different wavelengths. Alignment error is calculated from the relationship between the phase difference of images and the alignment error at each wavelength. The alignment error which affects the yield can be detected by directly measuring the alignment error of the circuit in the exposure area including the influence of the aberrations and distortions of lenses and the reticle writing error. Proper correction and improvement of the exposure apparatus can be achieved at early phase prior to electrical test.

8 Claims, 9 Drawing Sheets

PROCESS AND APPARATUS FOR MANUFACTURING SEMICONDUCTOR DEVICE

BACKGROUND OF THE INVENTION

The present invention relates to a process for manufacturing a semiconductor device and in particular to a method and apparatus for detecting and correcting the alignment error at a high precision in an exposure step and a process for manufacturing a semiconductor device based upon a result of the correction of the alignment error.

The process for manufacturing a semiconductor device is conducted by repeating on each layer the steps of forming a layer on a wafer; applying a photoresist which is a photosensitive agent upon the formed layer; exposing the resist with a circuit pattern on a reticle and developing it; and then forming the circuit pattern on the wafer by etching away the layer. If there is a difference of the position of the circuit pattern on exposure relative to an underlaying layer pattern in this manufacturing process, the circuit may then be broken or short-circuited, resulting in an defective semiconductor device. Accordingly, the relative difference in position between a registering mark which is formed of the resist after the development and an alignment mark on the underlaying layer is automatically measured by means of an optical microscope and the difference in position is fed back to an exposure apparatus at subsequent exposing step. The alignment mark is usually provided in a region at the edge of an exposure area in which no circuit pattern is provided. The alignment mark is formed at a line width of 2 to 4 $\mu$m, which is larger in comparison with the circuit line width so that it can be resolved by an optical detecting method.

The present inventors have found that following problems which have not heretofore been considered will occur since a tolerable error in alignment is about 30 nm for DRAMs having a line width of 0.1 $\mu$m which will be developed in the future.

A first problem resides in an error of writing using a reticle. The pattern on the reticle is scanned by means of an electron beam scanning apparatus. The error in position of scanning is about 50 nm on the reticle. In case of ⅕ scaled down exposure, the error is about 10 nm on the wafer, which is not negligible for the tolerable error of 30 nm.

Accordingly, the shift of the alignment mark at the edge of the exposure area does not necessarily match with that of the circuit at the exposure area.

A second problem resides in the distortion of a projecting lens of the exposure apparatus. Since the image of the reticle which is transferred upon the wafer by means of the projecting lens also has a distortion of about 10 nm, this also causes the mismatch of the alignment error of the alignment mark with the circuit.

In order to overcome these problems, it is necessary to measure the alignment error by measuring the circuit pattern per se rather than the alignment mark. At this time, it is difficult to resolve the circuit pattern having a width of 0.1 $\mu$m by using a prior art optical microscope. At this end, a method of measuring the alignment mark on the circuit area by using an SEM (scanning electron microscope) after etching is disclosed in, for example, SPIE, Vol. 3677, pp 239 to 247, 1999. This method is conducted by measuring the distance between the contour of a connection hole and the edge of the underlaying wiring pattern at the bottom of the hole, between the wiring layers.

However, only the surface contour can be detected since SEM conducts the image detection relying upon the amount of the secondary electrons which are generated on the surface of an object to be observed. In other words, if the underlaying layer wiring pattern is larger than the diameter of the connection hole, it would be difficult to measure the alignment error by means of the SEF since the edge of the wiring patterns then could not be detected from the bottom of the hole.

SUMMARY OF THE INVENTION

The present invention provides a process for measuring the alignment error at the step for exposing a semiconductor with light in which the underlaying layer pattern is not exposed on the surface in the circuit area. Novel features and advantages will be apparent from the following description and the annexed drawings.

In accordance with the present invention, a process for manufacturing a semiconductor device comprises the steps of:

(1) forming a first pattern on a substrate;
(2) forming a second pattern on said first pattern;
(3) detecting a first image by irradiating said substrate on which said first and second patterns are formed, with illuminating light having a first wavelength;
(4) detecting a second image by irradiating said substrate on which said first and second patterns are formed, with illuminating light having a second wavelength;
(5) calculating the relative positional difference between said first and second images;
(6) preliminarily determining the relationship between the relative positional difference between the first and second images and the positional difference of said second pattern relative to said first pattern;
(7) inputting the relative positional difference between said first and second images into the said relationship;
(8) calculating the positional difference of said second pattern relative to said first pattern;
(9) feeding back said calculated positional difference to an exposing apparatus for forming said second pattern in next process as a correction value; and
(10) forming the second pattern, the positional difference of which is corrected by exposing a second pattern by means of exposing apparatus using the fed back correction value.

This makes it possible to measure the positional difference of the second pattern having a size which is less than the limit of the optical resolution relative to the first pattern. Accordingly, the alignment error in the circuit area including the error due to the influences of the lens distortion and the reticle writing error can be determined, so that high accurate correction for the exposing apparatus can be conducted.

The process for manufacturing a semiconductor device is characterized in that light which is detected at the steps for detecting said first and second images is polarized in a direction parallel with the longitudinal directions of said first and second patterns.

Since this makes it possible to detect said first and second images at high contrast, measuring the alignment error at high accuracy can be carried.

The process for manufacturing a semiconductor device is characterized in that said first and second patterns are a plurality of patterns having the same pitch.

It is possible to detect the images of a plurality of patterns in which the relative positional differences between the first and second patterns are equal. Accordingly, measuring the alignment error at high accuracy in which the influence of the local deformation of the pattern is small can be achieved.

The process for manufacturing a semiconductor device is characterized in that said step for calculating the relative positional difference between said first and second images calculates the phase at a frequency corresponding to the maximum spectrum which is obtained by Fourier-transforming the images of said plurality of patterns in a direction in which said plurality of patterns are arrayed so that the relative positional difference is calculated from the calculated phase.

The average relative positional error between said first and second patterns in said plurality of patterns can be achieved at high speed and high accuracy.

These and other objects, features and advantages of the invention will be apparent from the following more particular description of preferred embodiments of the invention, as illustrated in the accompanying drawings.

DESCRIPTION OF THE EMBODIMENTS

Figure 1:
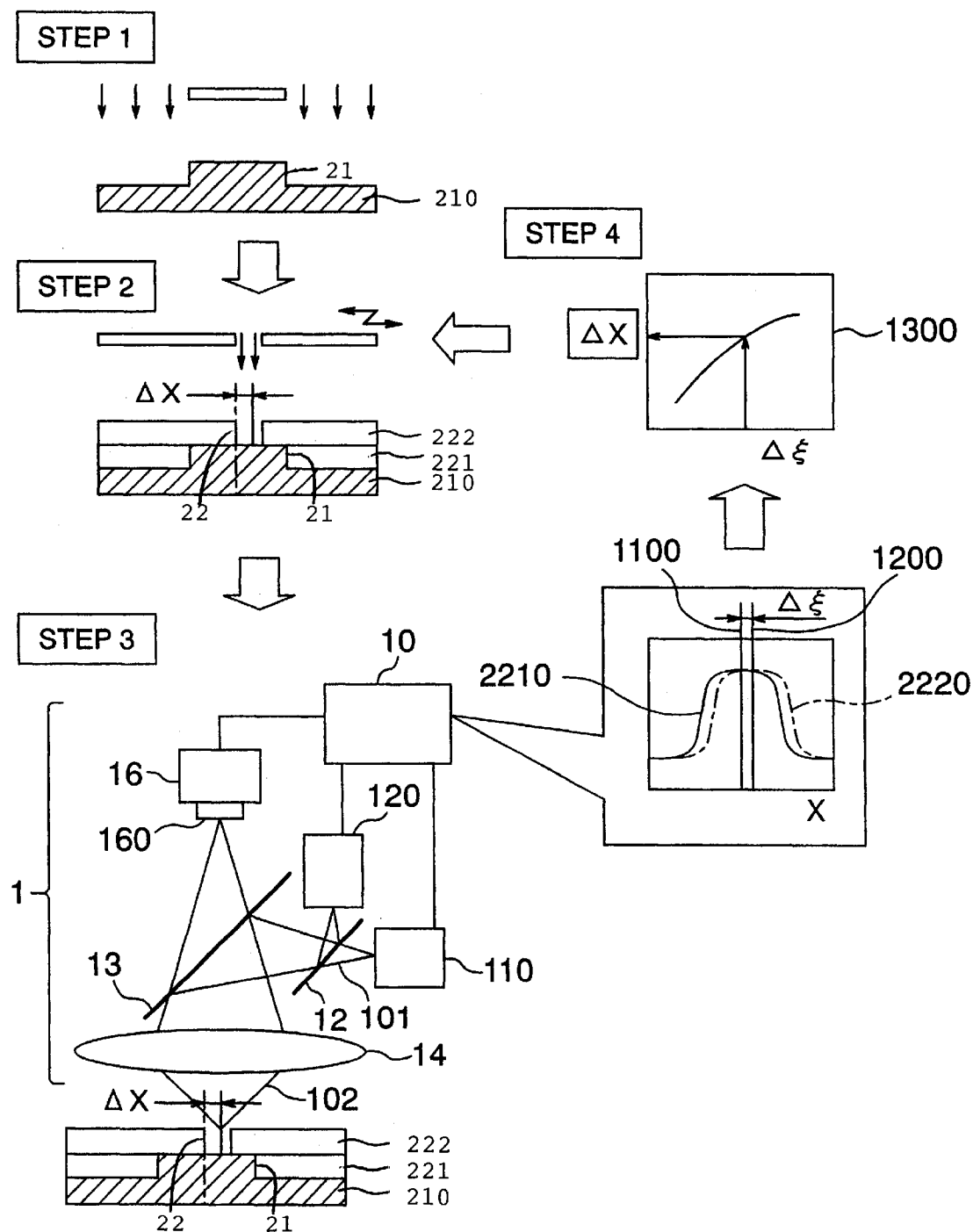
FIG. 1 is a diagram explaining the flow of the process for manufacturing a semiconductor device of the present invention.

Now, an embodiment of a process for manufacturing a semiconductor device in accordance with the present invention will be described with reference to FIG. 1.

At step 1, a first pattern 21 is formed by developing and etching the exposed photosensitive agent on a substrate 210 after it is exposed to light by means of an illustrated exposing apparatus.

At next step 2, a second pattern 22 is formed by a process as follows: After an oxide layer 221 is formed on the first pattern 21, it is polished. After an oxide layer 222 is formed, a photosenitive agent on the substrate is exposed to light, and it is developed and etched.

At step 3, an image 2210 of the second pattern 22 is picked up by means of an alignment error measuring apparatus 1. Firstly, a control and processing unit 10 turns on a light source 110 for emitting light having a first wavelength. Light 101 which is emitted from the light source 110 of the first wavelength is transmitted through a beam splitter 12 and is reflected on a beam splitter 13 and is projected on the device to form a second pattern thereon via an objective lens 14. The reflected light 102 of the second pattern 22 is imaged upon an image pick up surface 160 of an imaging device 16 via the objective lens 14 and beam splitter 13. An image 2210 of the second pattern of the light having the first wave length is processed by the control and processing unit 10 so that the center position 1100 is calculated.

Subsequently, the control and processing unit 10 turns off the light source 110 of the first wavelength and turns on the light source 120 of second wave length. Light having the second wavelength travels through the same optical path along which the light 101 emitted from the above-mentioned light source of the first wavelength travels so that a second pattern of the light having the second wavelength is imaged upon the image pick up surface of the imaging device 16. The image 2220 of the second pattern of the second wavelength light is processed by the control and processing unit 10 so that a central position 1200 is calculated.

Subsequently, the control and processing unit 10 turns off the light source 11 of the first wave-length and turns on the light source 120 of second wave length. Light having the second wave length travels through the same optical path along which the light 101 emitted from the above-mentioned light source of the first wave length travels so that a second pattern of the light having the second wave length is imaged upon the image pick up surface of the imaging device 16. The image 2220 of the second pattern of the second wave length light is processed by the control and processing unit 10 so that a central position 1200 is calculated.

The control and processing unit computes the difference $\Delta\xi$ between the center position 1100 of the second pattern image of the first wavelength light and the center position 1200 of the second pattern image of the second wavelength light. If the first and second patterns are detected as a plurality of line patterns having equal pitches, the difference $\Delta\xi$ could be calculated as an average of the misalignment of the plurality of patterns. The alignment accuracy can be enhanced by the averaging. Since transistors are disposed at equal pitch, the pitch of the first pattern is usually equal to that of the second pattern. It is possible to detect these patterns as plural line patterns having equal pitches.

At step 4, the alignment error $\Delta x$ is calculated in accordance with the relation 1300 between the preliminarily determined difference between the center positions of the second pattern images of the first and second wavelength lights and the alignment error between the first and second patterns. The $\Delta x$ is fed back to the exposing apparatus as an alignment error correction value when the second pattern is projected at next step 2.

The exposing apparatus exposes the second pattern upon a new substrate on which the first pattern is formed and a photoresist is applied. The second pattern, the alignment error of which has been corrected relative to the first pattern can be formed on the substrate by conducting the development and etching of the substrate to which the second pattern is exposed.

Figure 2:
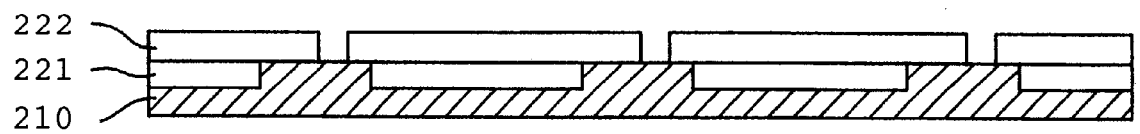
FIG. 2 is a sectional view of the semiconductor device explaining a first and second patterns comprising a plurality of line patterns, the alignment error of which is to be calculated in accordance with the present invention.
Figure 3:
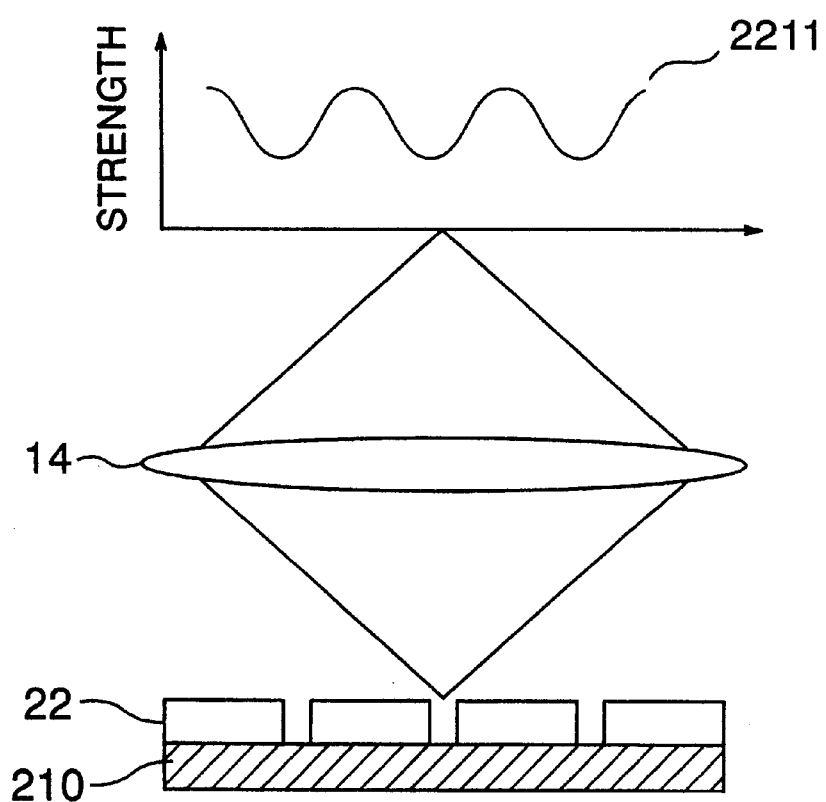
FIG. 3 is a diagram explaining an optical image of the second pattern.

Now, the principle of a present process for measuring the alignment error between the first and second patterns will be described. The first and second patterns are assumed to be a plurality of line patterns having equal pitches. As shown in FIG. 2, the first pattern is a stepped pattern of silicon 210. An isolation pattern having a width of 0.15 µm is formed by flattening a recess with an oxide layer 221. It is assumed that the second pattern have grooves in an oxide layer 222 having a width of 0.08 µm for forming metal gates. Pitch is assumed to be 0.3 µm. The optical resolution R(µm) of the pattern is defined as follows:

denotes the wavelength of light emitted from the light sources 110 and 120. NA denotes the aperture ratio of the objective lens 14. When NA is 0.9 and λ is 266 µm, which is the biquadratic harmonics of an YAG laser, R=0.148 µm in accordance with (1). The line width of the second pattern which is 0.08 µm is less than the resolution. As shown in FIG. 3, the light strength distribution 2211 of the image if only the second pattern 22 should be formed on the silicon 210 is a cosine wave so that the second pattern is not resolved.

A case will be considered in which both of the images of the first and second patterns 21 and 22 are cosine waves, so that the resultant image of the first and second images is obtained on the image pick up surface 160.

The images of the first pattern 21 is represented as follows:

$$A\cos\left(2\pi \frac{x}{P}\right) \quad (2)$$

The image of the second pattern 22 which is shifted by relative to the first pattern 21 is represented as follows:

$$B\cos\left(2\pi \frac{x+\Delta x}{P}\right) \quad (3)$$

X denotes a coordinate on the image pick up surface 160 and P denotes the pitch of the first and second patterns.

Formulae (2) and (3) are added to provide the following equation.

$$A\cos\left(2\pi\frac{x}{P}\right) + B\cos\left(2\pi\frac{x+\Delta x}{P}\right) = \quad (4)$$

$$\left(A + B\cos\left(2\pi\frac{\Delta x}{P}\right)\right)\cos\left(2\pi\frac{x}{P}\right) - B\sin\left(2\pi\frac{\Delta x}{P}\right)\sin\left(2\pi\frac{x}{P}\right) =$$

$$C\cos\left(2\pi\frac{x}{P}\right) - D\sin\left(2\pi\frac{x}{P}\right) =$$

$$\sqrt{C^2+D^2}\left(\frac{C}{\sqrt{C^2+D^2}}\cos\left(2\pi\frac{x}{P}\right) - \frac{C}{\sqrt{C^2+D^2}}\sin\left(2\pi\frac{x}{P}\right)\right) =$$

$$\sqrt{C^2+D^2}\cos\left(2\pi\frac{x}{P}+\varepsilon\right)$$

C and D denotes constants, which are represented by equations (6) and (6), respectively.

$$C = A + B\cos\left(2\pi\frac{\Delta x}{P}\right) \quad (5)$$

$$D = B\sin\left(2\pi\frac{\Delta x}{P}\right) \quad (6)$$

It is found from the equation (4) that the resultant image is a sinusoidal wave having a phase shift ε relative to the first pattern 21. Accordingly, it is possible to calculate the alignment error ΔX from the phase shift ε if the relation between the alignment ΔX error and the phase shift ε is preliminarily determined.

Meanwhile, it is not possible to determine ΔX only from the phase shift ε since the phase shift ε of the cosine wave on the image pick up surface 160, that is the shift amount varies with the alignment error of a wafer.

Hence, the first and second patterns 21 and 22 is formed by projecting light having a second wavelength which is different from that of the first wavelength. The phase shift ε' of the image on the image pick up surface 160 at this time is determined. The relation between the phase shift ε' and Δx at the second wavelength is different from that at the first wavelength.

The influence of the above-mentioned alignment error of the wafer is cancelled by taking the difference Δε(=ε−ε') of the phase deviations at the first and second wavelengths. It is thus possible to determine Δx from the relation between the phase shift ε and Δx.

Figure 4:
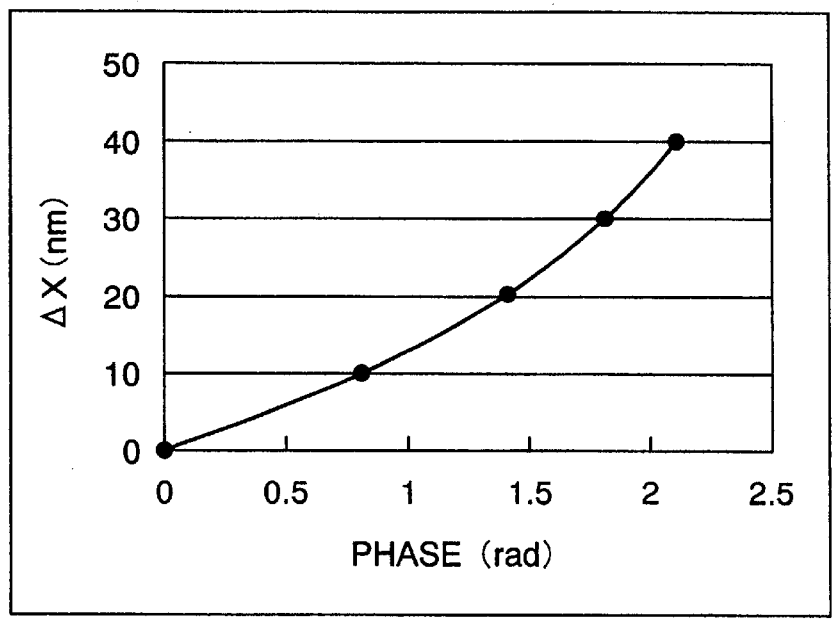
FIG. 4 is a graph explaining the relation between the phase and the alignment error of the optical image at a wavelength of 266 nm.
Figure 5:
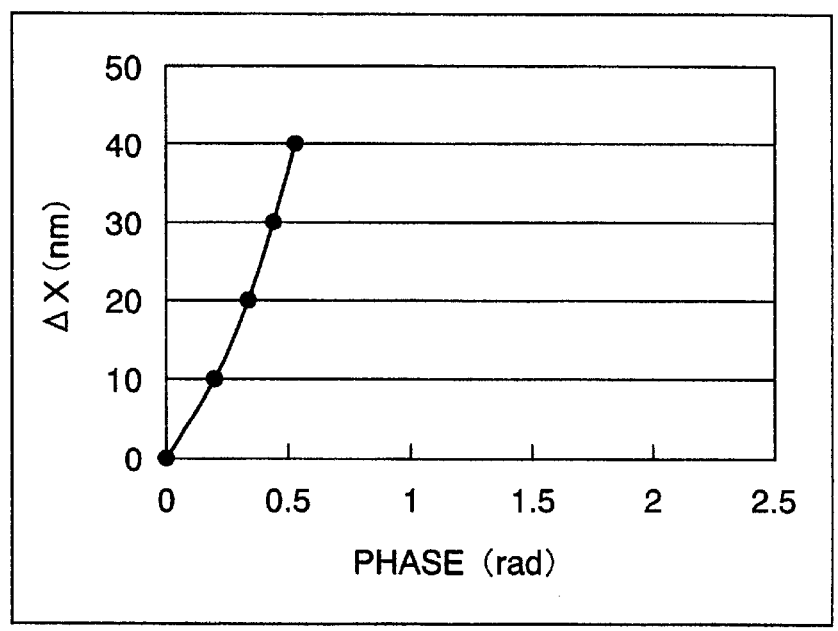
FIG. 5 is a graph explaining the relation between the phase and the alignment error of the optical image at a wavelength of 308 nm.
Figure 6:
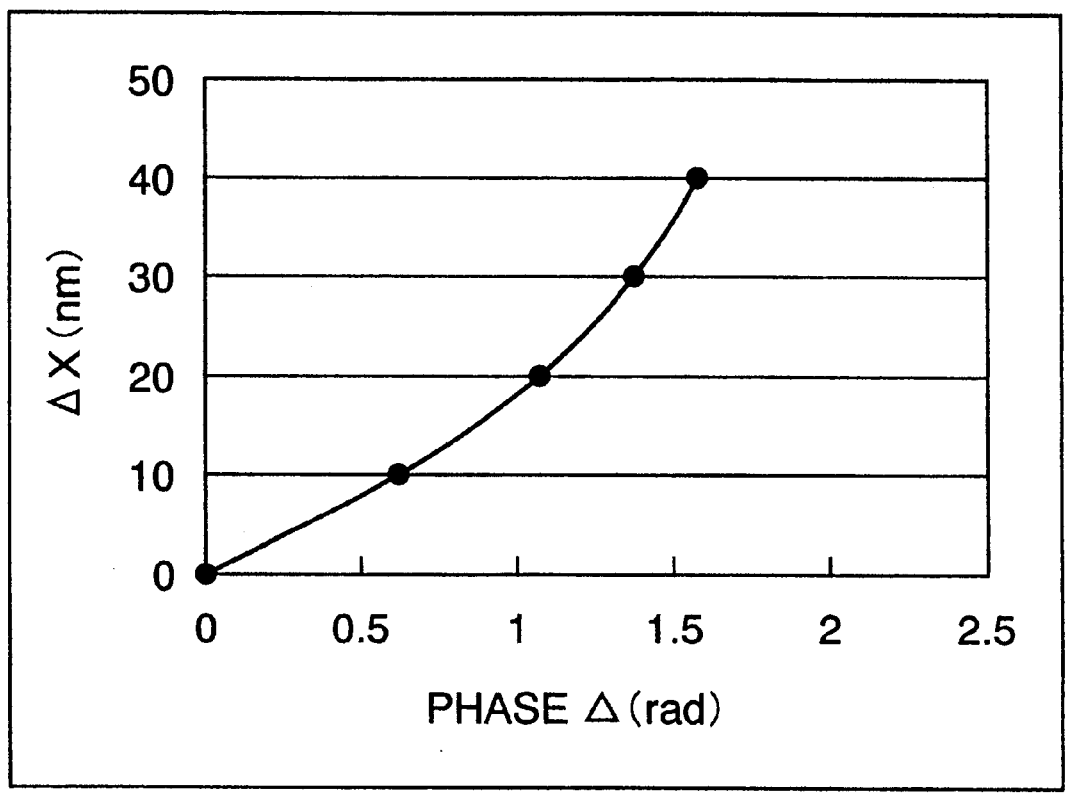
FIG. 6 is a graph explaining the relation between the phase and the alignment error of the optical image at a wavelengths of 266 and 308 nm.

FIGS. 4 and 5 show the result of the relations between the phase shifts ε, ε' and the alignment error Δx using wavelengths 266 nm of the biquadratic harmonic of YAG laser and 308 nm of XeCL eximer laser, which are obtained by wave optics simulation. FIG. 6 shows the relation between shift difference Δε and Δx.

Now, a method of calculating phase ε from the image of a plurality of line patterns which are cosine waves will be described with reference to FIG. 7. Firstly, the image of a cosine wave 2211 is picked up by the image pick up device 16 and is fed to the control and processing unit 10 as a signal representative of the strength distribution. Subsequently, the control and processing circuit 10 conducts a Fourier transformation for the cosine wave 2211 using FET (Fast Fourier Transformation) to obtain the spectral strength distribution 2221 at the frequency domain. Based upon this result, the phase ε is calculated in accordance with (7).

$$\varepsilon = \tan^{-1}\left(\frac{Sm}{Cm}\right) \quad (7)$$

Sm denotes a constant of sine wave after the Fourier transformation corresponding to the maximum spectral frequency and Cm denotes a constant of the cosine wave after the Fourier transformation corresponding to the maximum spectral frequency.

Figure 7:
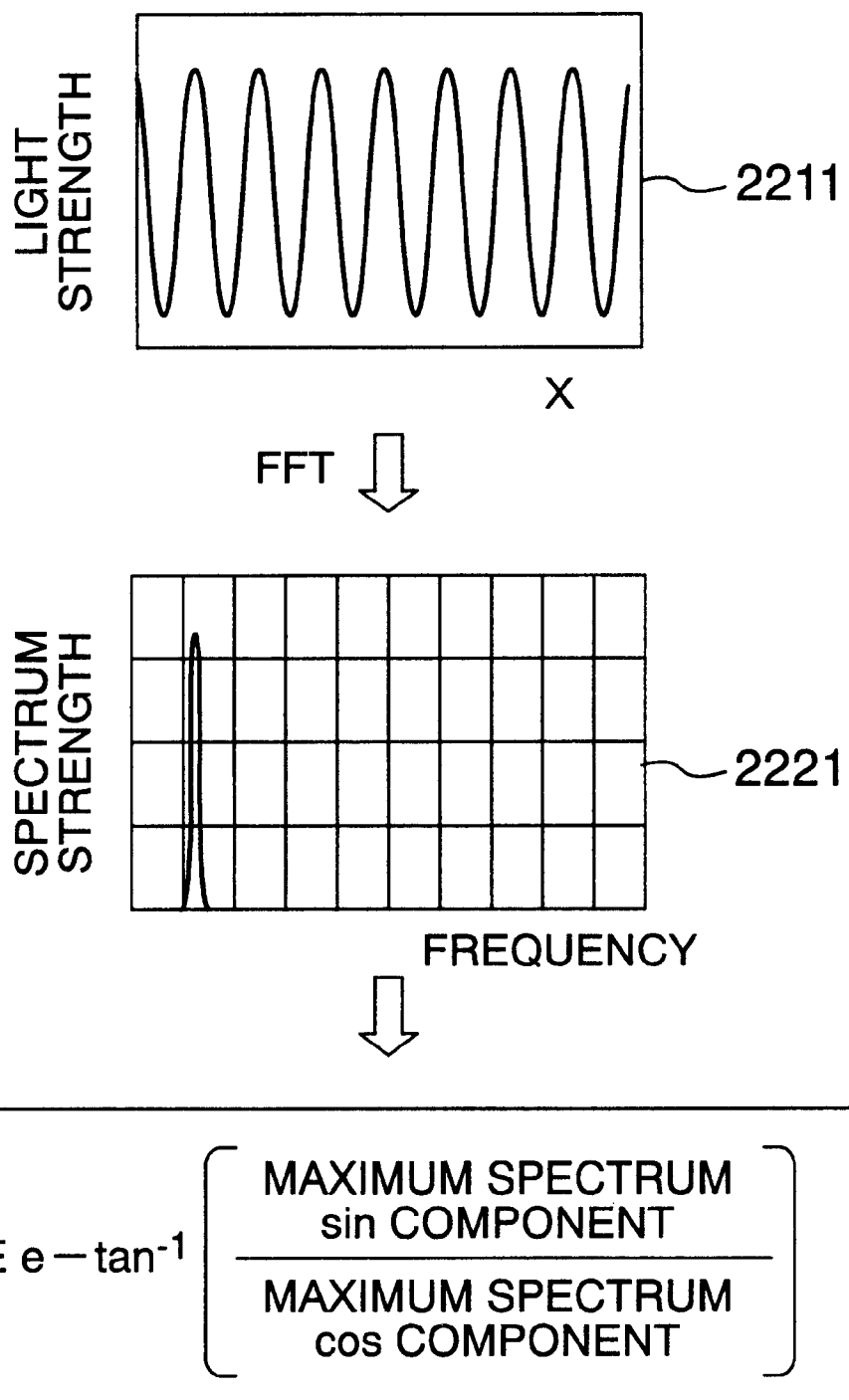
FIG. 7 is a diagram explaining the flow for calculating the phase of the optical image.
Figure 8:
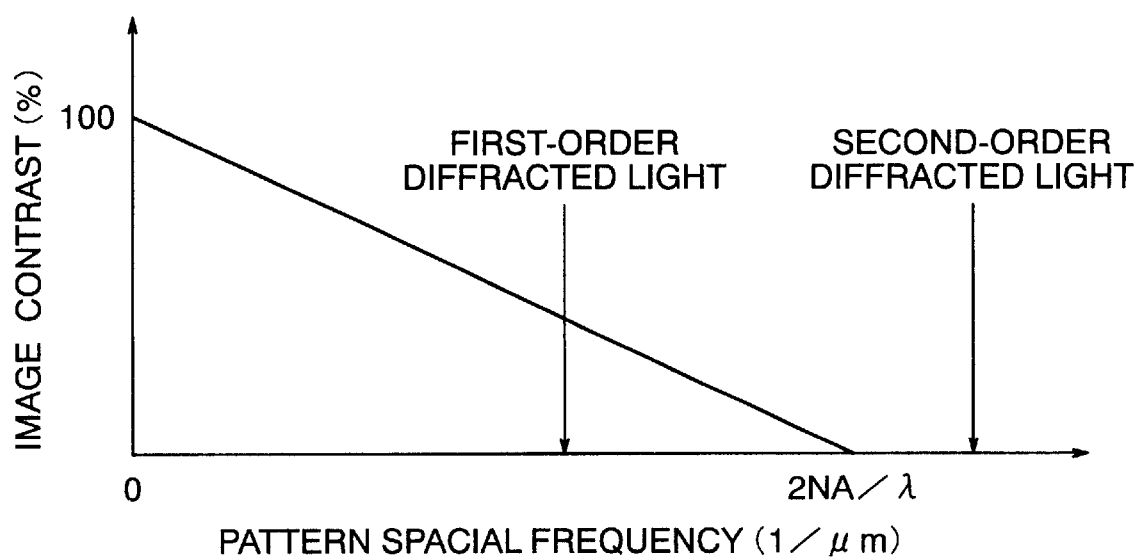
FIG. 8 is a graph showing the contrast characteristics for the pattern special frequency of an objective lens.

In order to stably determine the maximum spectrum in this flow shown in FIG. 7, it is preferable that the image of the plurality of line patterns be substantially cosine waves. At this end, it is required that the objective lens 14 will not transmit the second or more-order diffracted light from the plurality of line patterns, but the first-order diffracted light.

This requirement will now be described with reference to FIG. 7. FIG. 7 shows the relation between the spacial frequency of the pattern and the image contrast when coherent imaging (imaging of illuminating light in which the aperture ratio of NA of an illuminating system to that of the objective lens is one or more) is conducted by means of the objective lens 14. The cut off frequency fc at which the image contrast becomes zero is represented by the following equation.

$$fc = \frac{2NA}{\lambda} \quad (8)$$

NA denotes the aperture ratio of the objective lens and denotes the wavelength of illuminating light. Accordingly, the requirement that the objective lens will not transmit the above-mentioned second-order or more diffracted light, but the first-order diffracted light is that the reference frequency of the pattern is not higher than the cut off frequency exceeds fc and is given as follows:

$$\frac{1}{P} < \frac{2NA}{\lambda} < \frac{2}{P} \quad (9)$$

P denotes the pitch of the pattern. For example, for the pattern pitch P of 0.3 μm, 1/P=3.33 (1/μm), 2/P=6.67 (1/μm). For λ=266 nm, 2NA/λ=6.77, which does not satisfy the unequal equation on the right side of the formula (9) but substantially satisfies the formula (9) since the contrast of 2/P (second-order diffracted light) is (6.77−6.67)/6.67×100= 1.5%, so that the contrast of the second-order diffracted light is substantially zero.

Figure 9:
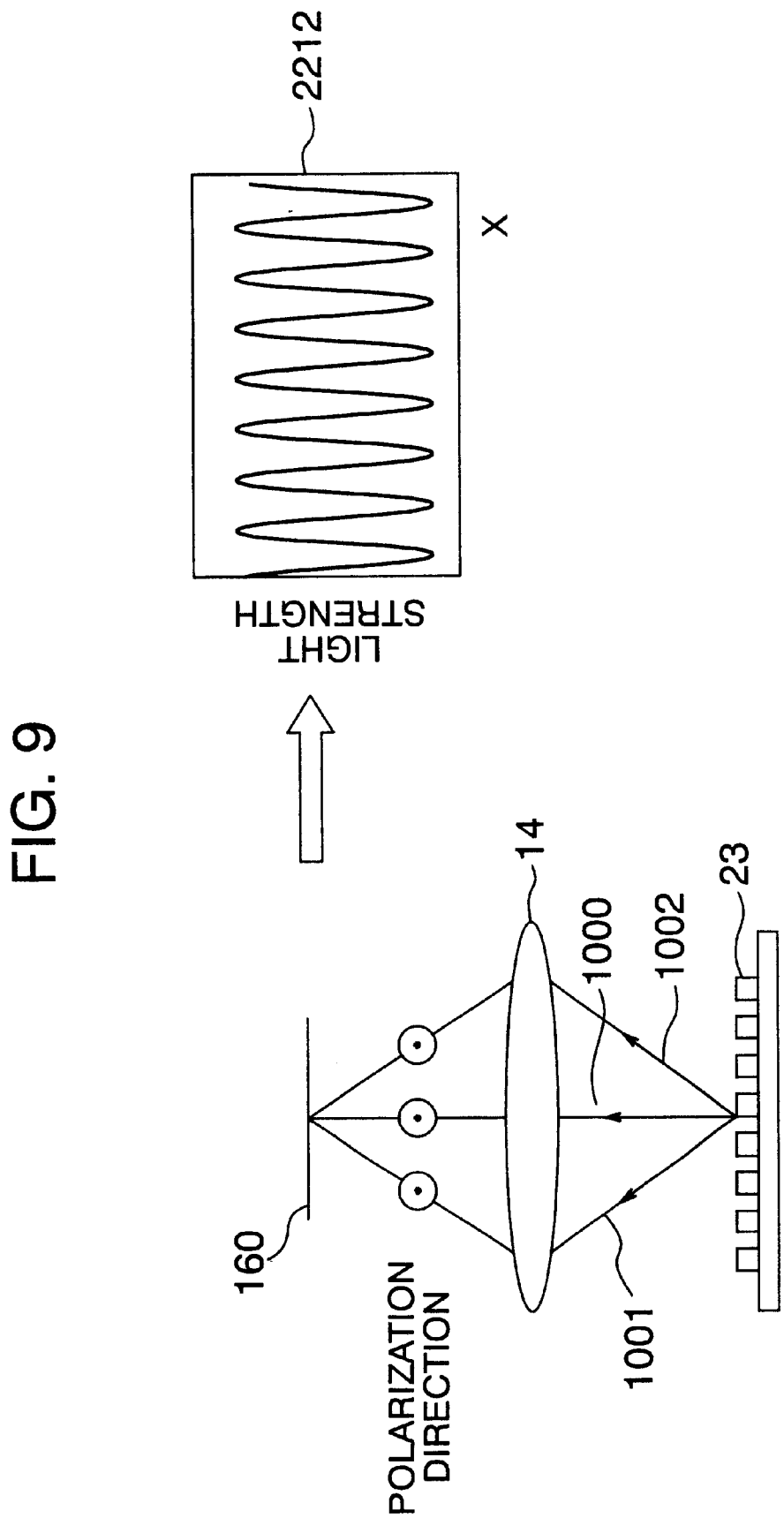
FIG. 9 is a substantial front view showing an optical system for detecting the image with light which is polarized in parallel with the longitudinal direction of the pattern and a graph showing the distribution of the light strength of the detecting image.
Figure 10:
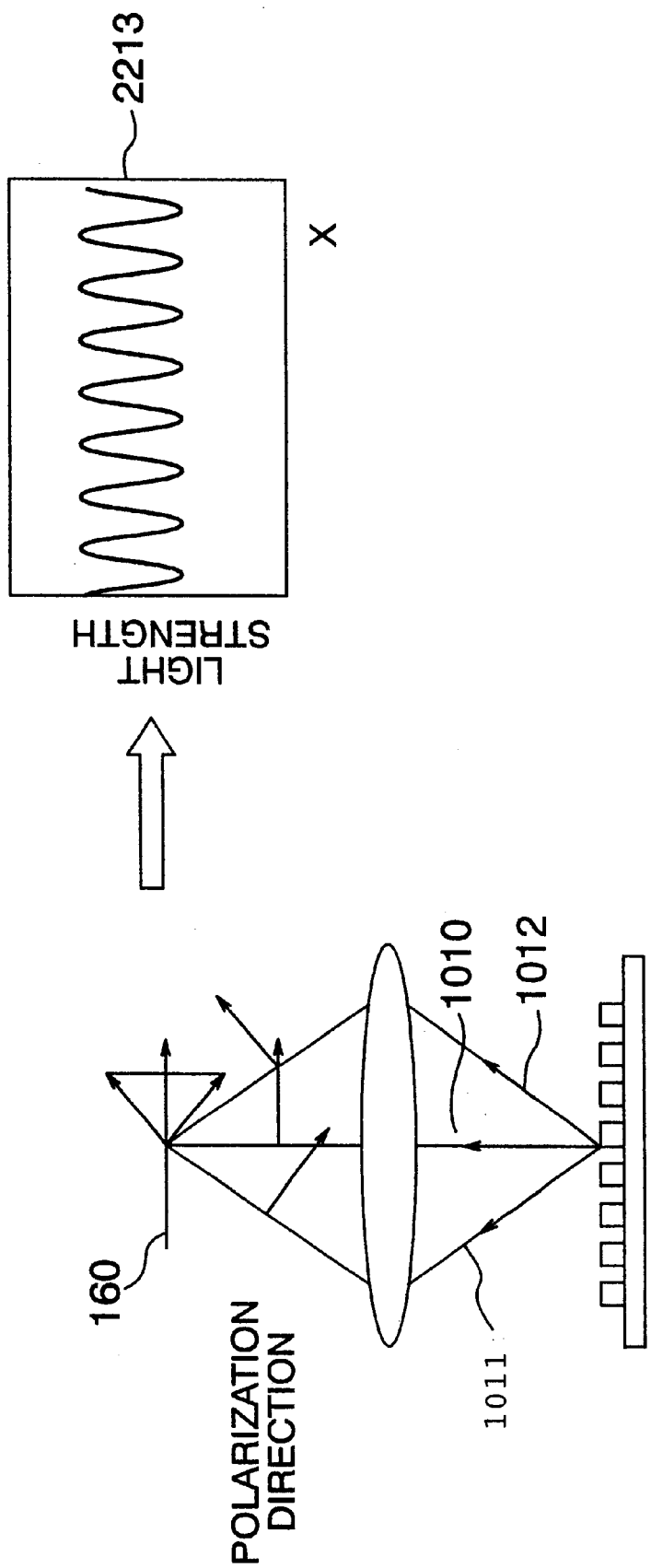
FIG. 10 is a substantial front view showing an optical system for detecting the image with light which is polarized in a direction normal to the longitudinal direction of the pattern and a graph showing the distribution of the light strength of the detecting image.

To make the first-order diffracted light is important to enhance the accuracy of the phase calculation. The principle of an improvement conducted by an apparatus will be described with reference to FIGS. 9 and 10. FIG. 9 shows the pattern image 2212 when the image of the pattern 23 is detected with light which is polarized in parallel with the longitudinal direction of the pattern. The polarization direction of the zero-order, minus first-order and first order lights 1000, 1001 and 1002, on the image pick up surface 160, respectively are normal to the paper of the drawing. Interference of these lights to each other provides an excellent image contrast. If the detection is conducted with light which is polarized in a direction perpendicular to the longitudinal direction of the pattern as shown in FIG. 10, the zero-order, minus first-order and first-order diffracted lights 1010, 1011 and 1012 are not same on the image pick up surface 160. The minus first-order diffracted light 1011 and the first-order diffracted light 1012 which contribute to the interference becomes sinusoidal components, so that the contrast of the pattern image 2213 is lowered. Accordingly, the contrast of the pattern image is enhanced by detecting it with only light which is polarized in a direction in parallel with the longitudinal direction of the pattern.

Figure 11:
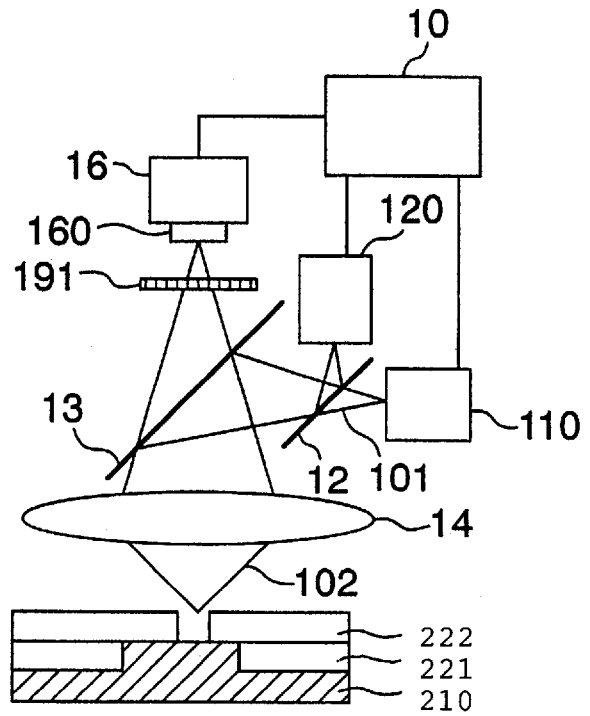
FIG. 11 is a substantial front view of the optical system explaining one embodiment for selecting light which is polarized in a direction normal to the longitudinal direction of the pattern.
Figure 12:
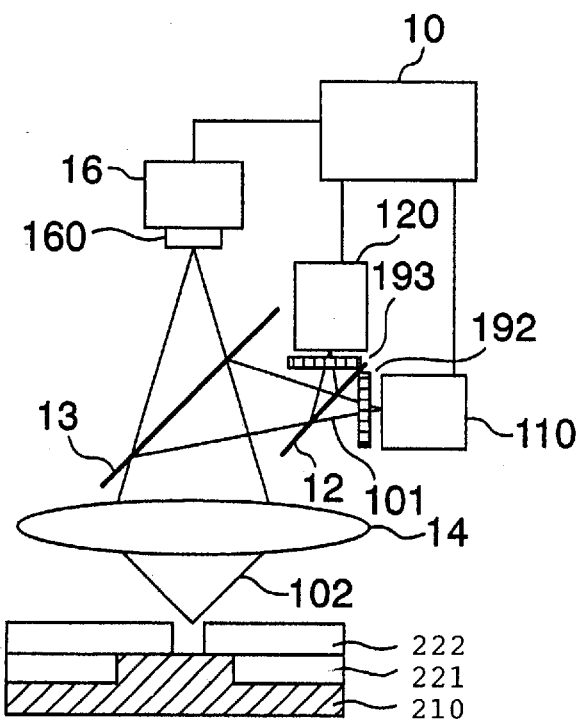
FIG. 12 is a substantial front view of the optical system explaining another embodiment for selecting light which is polarized in a direction normal to the longitudinal direction of the pattern.

Now, means which implements the principle to enhance the contrast on the apparatus will be described with reference to FIGS. 11 and 12. In FIG. 11, a polarization element 191 which transmits only light which is polarized in the longitudinal direction of the pattern (direction normal to the paper of the drawing) is disposed in front of the imaging device 16. In an alternative embodiment as shown in FIG. 12, polarization elements 192 and 193 which transmit only light which is polarized in the longitudinal direction of the pattern (direction normal to the paper) are disposed on the exit side of the light sources 110 and 120, respectively. In a further embodiment, the installation direction of the light source 110 or 120 may be matched with the longitudinal direction of the pattern if the light source 110 or 120 emits linearly polarized light such as laser.

Since the alignment error between a real pattern in a circuit of the semiconductor device and the underlaying pattern can be measured by using the real pattern in the circuit of the semiconductor device rather than the alignment mark at the exposed area edge in the above-mentioned embodiments, it is possible to measure the real alignment error of the circuit pattern, including the reticle writing error and the lens distortion. This enables a proper correction value which will not cause any defect in the circuit pattern to be fed back to the exposing apparatus, contributing to an enhancement in the yield of the future semiconductor device having the size of 0.1 μm or less.

The invention may be embodied in other specific forms without departing from the spirit or essential characteristics thereof. The present embodiment is therefor to be considered in all respect as illustrative and not restrictive, the scope of the invention being indicated by the appended claims rather than by the foregoing description and all changes which come within the meaning and range of equivalency of the claims are therefore intended to be embraced therein.

What is claimed is:

1. A process for manufacturing a semiconductor device comprising the steps of:
    forming a first pattern on a substrate;
    forming a second pattern on said first pattern;
    detecting a first image by irradiating said substrate on which said first and second patterns are formed, with illuminating light having a first wavelength;
    detecting a second image by irradiating said substrate on which said first and second patterns are formed, with illuminating light having a second wavelength;
    calculating a relative positional difference between said first and second images;
    calculating a positional difference of said second pattern relative to said first pattern from a calculated result of the relative positional difference between said first and second images by using a relationship between the relative positional difference between the first and second images and the positional difference of said second pattern relative to said first pattern; and
    feeding back said calculated positional difference to an exposing apparatus for forming said second pattern in a next process as a correction value.

2. A process for manufacturing a semiconductor device as defined in claim 1 in which said first and second patterns are composed of periodic rectangular patterns having a same pitch.

3. A process for manufacturing a semiconductor device as defined in claim 2 in which light which is detected at the steps for detecting said first and second images is polarized in a direction parallel with longitudinal directions of said rectangular patterns of said first and second patterns.

4. A process for manufacturing a semiconductor device as defined in claim 1 in which said step for calculating the relative positional difference between said first and second images calculates a phase of the complete amplitude of which spectrum is the maximum in the complex amplitudes obtained by Fourier-transforming the images of said first and second patterns in a direction in which said first and second patterns are arrayed so that the relative positional difference is calculated from the calculated phase.

5. A process for manufacturing a semiconductor device comprising the steps of:
    detecting a first image by irradiating a substrate on which first and second patterns are formed, with illuminating light having a first wavelength;
    detecting a second image by irradiating said substrate with illuminating light having a second wavelength;
    calculating relative positional difference between said detected first and second images;
    calculating a positional difference of said second pattern relative to said first pattern from information on said calculated relative positional difference;
    transmitting the calculated positional difference to an exposing apparatus for forming said second pattern; and
    exposing a second pattern layer on a new substrate which is formed with a first pattern layer.

6. An apparatus for measuring a positional difference between a first pattern and a second pattern which are formed on an object comprising;
    first illuminating means for illuminating said first and second patterns of said object with light having a first wavelength; second illuminating means for illuminating said first and second patterns of said object with light having a second wavelength different from the first wavelength;

imaging means for picking up the image of said first and second patterns;

means for selecting among said first and second wavelength light; and image processing means for calculating the positional difference said first and second patterns from a positional difference of images of said first and second patterns, which are picked up by using said first and second wavelength lights, respectively.

7. An apparatus as defined in claim 6 in which said first and second patterns are composed of periodic rectangular patterns having a same pitch.

8. An apparatus as defined in claim 7 and further including polarized light selecting means which selectively detects only the light which is polarized in a direction in parallel with longitudinal direction of said rectangular patterns of said first and second patterns.

* * * * *